US007282399B2

(12) United States Patent
Takahashi

(10) Patent No.: US 7,282,399 B2
(45) Date of Patent: Oct. 16, 2007

(54) METHOD FOR FORMING SEMICONDUCTOR DEVICE

(75) Inventor: Akira Takahashi, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 11/311,365

(22) Filed: Dec. 20, 2005

(65) Prior Publication Data

US 2006/0094173 A1 May 4, 2006

Related U.S. Application Data

(62) Division of application No. 10/445,859, filed on May 28, 2003, now Pat. No. 6,995,049, which is a division of application No. 09/962,190, filed on Sep. 26, 2001, now Pat. No. 6,632,710.

(30) Foreign Application Priority Data

Oct. 12, 2000 (JP) ............................ 2000-312351
Apr. 17, 2001 (JP) ............................ 2001-118227

(51) Int. Cl.
*H01L 21/00* (2006.01)
*H01L 21/84* (2006.01)

(52) U.S. Cl. ...................................... 438/149; 438/153

(58) Field of Classification Search ................ 438/149, 438/151, 153–154, 161, 164, 404
See application file for complete search history.

(56) References Cited

U.S. PATENT DOCUMENTS 5,914,510 A 6/1999 Hleda
6,060,738 A 5/2000 Hidaka et al.
6,130,457 A * 10/2000 Yu et al. ..................... 257/347
6,133,610 A 10/2000 Bolam et al.
6,287,901 B1 * 9/2001 Christensen et al. ........ 438/162
6,632,710 B2 10/2003 Takahashi

FOREIGN PATENT DOCUMENTS

JP 2001-338499 12/2001

* cited by examiner

*Primary Examiner*—Theresa Doan
(74) *Attorney, Agent, or Firm*—Volentine & Whitt, P.L.L.C.

(57) ABSTRACT

In a method for forming a silicon-on-insulator FET providing a contact to be given a fixed potential to a substrate, substrate-biasing between an SOI transistor and the silicon substrate is performed via a plug. As a result, the contact hole for the substrate-biasing does not need to pass through an insulating layer, a silicon layer, and an interlayer insulating layer. Therefore, the interlayer insulating layer can be made to have shallow depth. Ions can be implanted to the surface of the substrate via the contact hole for substrate biasing. As a result, contact holes for substrate-biasing can be formed without the contact holes for substrate-biasing causing an opening fault.

20 Claims, 13 Drawing Sheets

METHOD FOR FORMING SEMICONDUCTOR DEVICE

CROSS REFERENCE TO RELATED APPLICATION

This is a divisional application of application Ser. No. 10/445,859, filed May 28, 2003, now U.S. Pat. No. 6,995, 049, which is a divisional application of application Ser. No. 09/962,190, filed Sep. 26, 2001, now U.S. Pat. No. 6,632, 710, which are hereby incorporated by reference in their entirety for all purposes.

BACKGROUND OF THE INVENTION

1. Field of the Invention

The present invention generally relates to a method for forming a silicon-on-insulator FET, and more particularly, the present invention relates to the method for forming a silicon-on-insulator FET providing a contact to be given a fixed potential to a substrate reduction of contact resistance on a substrate having a SOI layer isolated with an insulating layer.

This application is counterparts of Japanese application Serial Number 312351/2000, filed Oct. 12, 2000 and Japanese application Serial Number 118227/2001, filed Apr. 17, 2001, the subject matter of which is incorporated herein by reference.

2. Description of the Related Art

The conventional SOI FETs have a "floating body" in which the body of the FET is located on an insulating layer and not electrically connected to a fixed potential. Floating body SOI devices can experience high leakage current and parasitic bipolar action. This disadvantage can be eliminated by providing a contact to the substrate to tie the body to a fixed potential.

In conventional arts, a method for forming a silicon-on-insulator FET providing a contact to be given a fixed potential to a substrate, is discussed as follows.

A silicon-on insulator (SOI) transistor includes a transistor region formed in a silicon layer on a substrate via an insulating layer. An interlayer insulating layer overlies the SOI transistor. The SOI transistor includes a conductive contact layer which extends through the interlayer insulating layer, the silicon layer, and the insulating layer. The conductive contact layer is filled in a contact hole which is formed by etching the interlayer insulating layer, the silicon layer, and the insulating layer so as to expose a surface of the substrate. The exposed surface of the substrate is implanted with ions via the contact hole to decrease a contact resistance.

The conventional SOI transistor has a performance disadvantage. Since the contact hole is formed by etching the interlayer insulating layer, the silicon layer and the insulating layer so as to expose a surface of the substrate, it is deep. As a result, a deep contact hole has a high aspect ratio. The ion-implantation to the surface of the substrate via the contact hole is hardly performed. The variation shape of the contact hole contributes to the variation of the contact variation. The contact hole for substrate-biasing is deeper than contact holes of a source, a drain, and a gate in the SOI transistor. If these contact holes are simultaneously formed each of portions, the contact hole for substrate-biasing causes an opening fault because of it is deep contact hole.

SUMMARY OF THE INVENTION

An object of the present invention is to provide a method for forming a silicon-on-insulator FET that can have ions implanted to the surface of the substrate via the contact hole for substrate-biasing. It can form the contact hole for substrate-biasing without the contact hole for substrate-biasing causing an opening fault.

According to one aspect of the present invention, for achieving the above object, there is provided a method for forming a silicon-on-insulator FET providing a contact to be given a fixed potential to a substrate, the method comprising: providing a semiconductor substrate having an insulating layer; forming a silicon layer on the insulating layer; forming a first conductive contact layer extending through the silicon layer and the insulating layer, the first conductive contact layer electrically connected to the substrate; forming an interlayer-insulating layer overlying the silicon layer; forming a through-hole in the interlayer-insulating layer, the through-hole formed so as to correspond to the first conductive contact layer; and filling a second conductive contact layer in the through-hole.

BRIEF DESCRIPTION OF THE DRAWINGS

While the specification concludes with claims particularly pointing out and distinctly claiming the subject matter that is regarded as the invention, the invention, along with the objects, features, and advantages thereof, will be better understood from the following description taken in connection with the accompanying drawings, in which:

DETAILED DESCRIPTION OF THE PREFERRED EMBODIMENTS

A method for forming a silicon-on-insulator FET according to a first preferred embodiment of the present invention will hereinafter be described in detail with reference to the accompanying drawings.

FIG. 1A-FIG. 1I are cross-sectional views showing a method for forming a silicon-on-insulator FET according to a first preferred embodiment of a present invention.

Figure 1A:
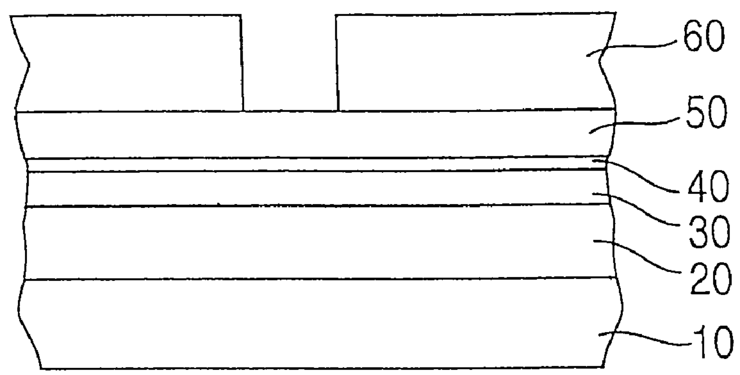
FIG. 1A-FIG. 1I are cross-sectional views showing a method for forming a silicon-on-insulator FET according to a first preferred embodiment of a present invention.

As shown in FIG. 1A, a silicon-on-insulator (SOI) structure is provided. Examples of the methods to form the SOI structure are called SIMOX (separation by implantation of oxygen) or a bonded wafer. The SOI structure is made up of a silicon substrate 10, an insulating layer 20, and a silicon layer 30. Then, a silicon oxide film 40 and a silicon nitride layer 50 are sequentially formed on the silicon layer 30. Then, a first resist pattern 60 is overlaid the silicon nitride layer 50. The first resist pattern 60 has an opening corresponding to a portion in which is formed a contact hole for a substrate-biasing. The first resist pattern 60 has other openings corresponding to each of portions in which is formed isolating portions between an active region (transistor region) in the silicon layer 30 (not shown).

Figure 1B:
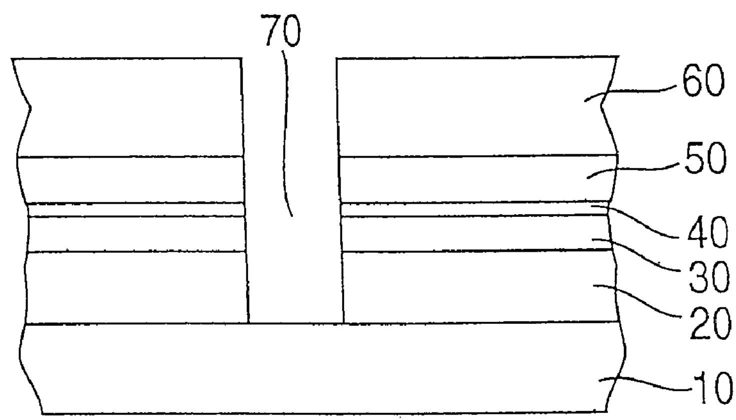

As shown in FIG. 1B, the silicon nitride layer 50, the silicon oxide film 40, the silicon layer 30, and the insulating layer 20 are etched using the first resist pattern 60 as an etching mask. As a result, a first contact hole 70 for substrate-biasing is formed so as to pass through the silicon nitride layer 50, the silicon oxide film 40, the silicon layer 30, and the insulating layer 20. Then, the first resist pattern 60 is removed.

Figure 1C:
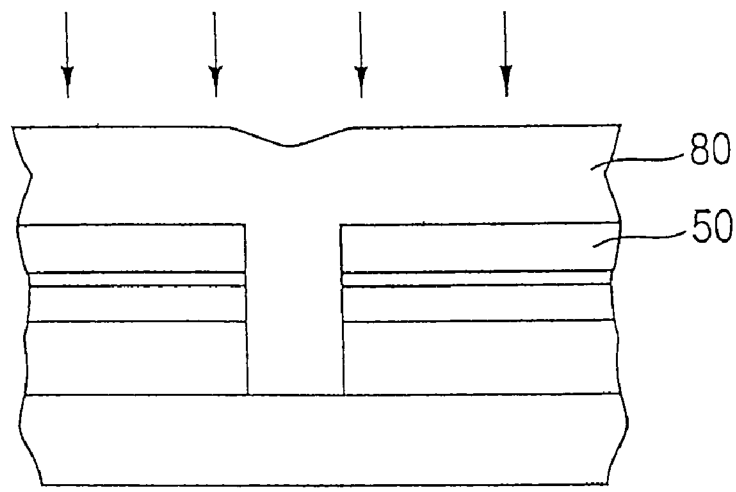

As shown in FIG. 1C, a polycrystalline silicon layer 80 is formed so as to fill the first contact hole 70 and overlie the silicon nitride layer 50. The polycrystalline silicon layer 80 is provided to have low-resistance contact by implanting ions. The ions are also diffused in a portion of the silicon substrate 10 for the substrate-biasing by annealing. Therefore, a diffused region in the silicon substrate 10 is formed by processes of the ion-implantation and the annealing, which can decrease the contact resistance for the substrate-biasing. The diffused region may be formed by implanting ions in the first contact hole 70 and by annealing.

Figure 1D:
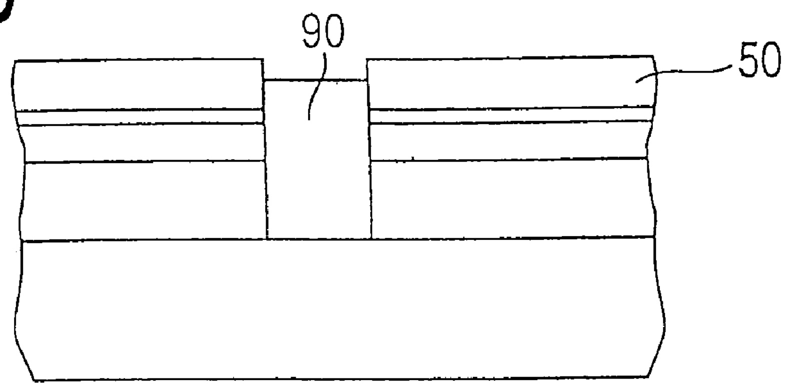

As shown in FIG. 1D, the polycrystalline silicon layer 80 is polished until a surface of the silicon nitride layer 50 is exposed by using CMP (Chemical Mechanical Polishing). As a result, a first conductive contact layer (plug) 90 of the polycrystalline silicon layer 80 is formed in the first contact hole 70.

Figure 1E:
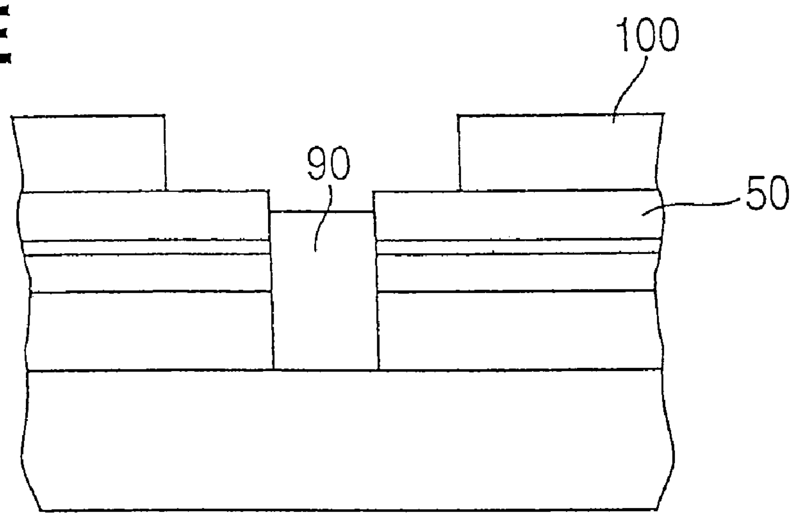

As shown in FIG. 1E, a second resist pattern 100 has an opening so as to expose a top surface of the plug 90. A diameter of the opening is larger than that of the plug 90. The second resist pattern 100 is overlaid the silicon nitride layer 50.

Figure 1F:
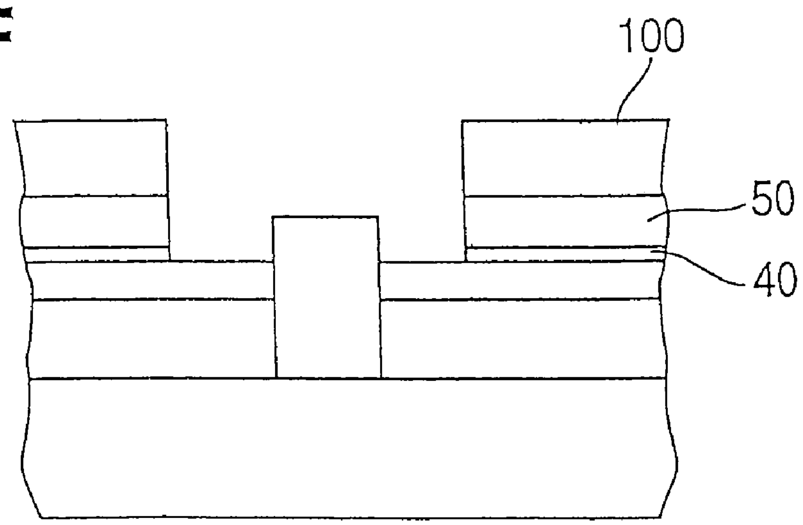

As shown in FIG. 1F, the silicon nitride layer 50 is etched using the second resist pattern 100 as an etching mask. At this time, since the diameter of the opening is larger than that of the plug 90, a tip of the plug 90 protrudes.

Figure 1G:
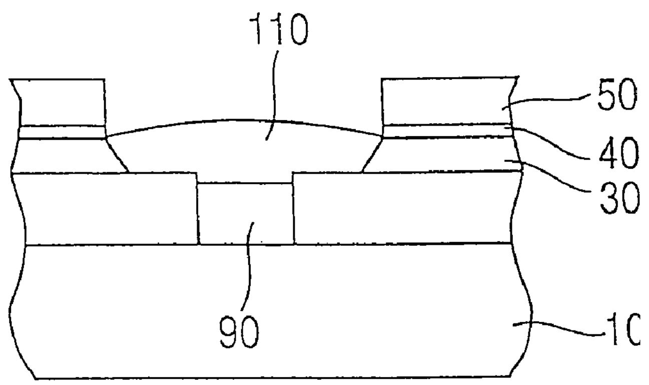

As shown in FIG. 1G, the annealing process is performed. As a result, the tip of the plug 90 and a portion of the silicon layer 30 around the tip of the plug 90 is changed from silicon and polycrystalline silicon to an oxide. Thus, a field oxide film 110 is formed. Other field oxide films are also formed in each of portions which are formed at isolating portions between active regions (transistor region) in the silicon layer 30 (not shown). The top surface of the field oxide film 110 can be a low height level because a field oxidation process is performed to the tip of the plug 90. Accordingly, the field oxidation process may be improved by the planation for interlayer insulating layers.

Figure 1H:
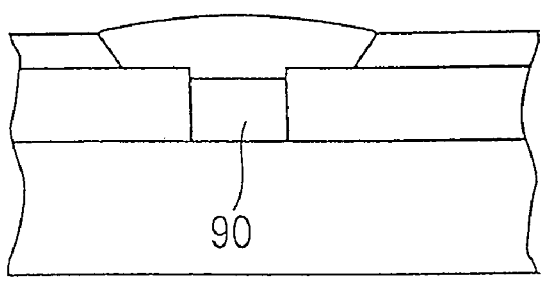

As shown in FIG. 1H, the silicon nitride layer 50 and the silicon oxide film 40 are removed.

Figure 1I:
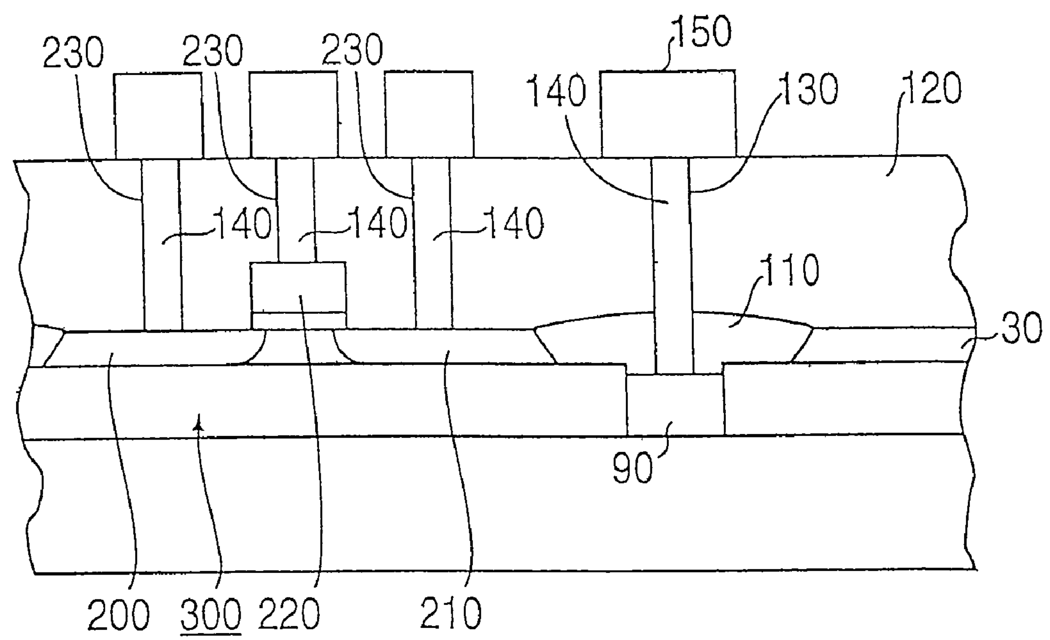

As shown in FIG. 1I, a field effect transistor (FET) 300 having a source 200, a drain 210, and a gate 220 are formed In the active region of the silicon layer 30. Then, an interlayer insulating layer 120 is overlaid an entire structure including the field oxide film 110 and the silicon layer 30 using CVD process. Here, the interlayer insulating layer 120 is a P-TEOS (Plasma-Tetraethoxysilane), a BPSG (Boro-Phospho-Silicate Glass), or an NSG (Non-doped Silicate Glass). Then, a second contact hole 130 is formed so as to pass through the interlayer insulating layer 120 and the field oxide film 110 and to expose a surface of the plug 90. The second contact hole 130 is formed so as to correspond to the first contact hole 70. Third contact holes 230 are formed so as to expose a source 200, a drain 210, and a gate 220 in the silicon layer 30, simultaneously with the second contact hole 130. The simultaneously forming process can be performed because the second and third contact holes 130 and 230 have the substantially same depth. Then, a conductive layer is overlaid the interlayer insulating layer 120 so as to fill with the second and third contact holes 130 and 230. Then, the conductive layer is polished until a surface of the interlayer insulating layer 120 is exposed by using CMP. As a result, second conductive contact layers 140 are simultaneously formed in the second and third contact holes 130 and 230. Here, the conductive layer is a tungsten (W). Then, an interconnection 150 is electrically connected to the respective second conductive contact layers 140.

As mentioned above, in the first preferred embodiment, the substrate-biasing between the SOI transistor and the silicon substrate 10 is performed via the plug 90. As a result, the contact hole for the substrate-biasing does not need to pass through the insulating layer 20, the silicon layer 30, and the interlayer insulating layer 120. Therefore, the interlayer insulating layer 120 can have shallow depth. Accordingly, by the first preferred embodiment, ions can be implanted easily to the surface of the substrate via the contact hole for substrate-biasing. It can form the contact hole for substrate-biasing without the contact hole for substrate-biasing causing an opening fault. It can be avoided the problem that the FET is electrically connected to the conductive contact layer in the contact hole because the plug is formed so as to be isolated from the active region of the silicon layer.

In the first preferred embodiment, a shallow trench isolation layer may be used instead of the field oxide film. The third contact hole 230 may be formed for only the source and the drain, or it may be formed for only one of the source and the drain.

A method to improve a law resistance between the plug 90 and the silicon substrate 10 is described as follows.

For using a silicide layer to decrease a resistance between the plug 90 and the silicon substrate 10, a high melting point metal is formed so as to fill the first contact hole 70 and overlie the silicon nitride layer 50, after removing the resist pattern 60 as shown in FIG. 1B. However, the silicide layer is also formed on the silicon layer 30 exposed in the first contact hole 70.

In a modification for the first preferred embodiment, the high melting point metal is formed so as to fill the first contact hole 70 and overlie the silicon nitride layer 50. After that, the plug 90 is formed before performing the annealing process. Then, the high melting point metal on the silicon layer 30 exposed in the first contact hole 70, is removed without removing the high melting point metal between the plug 90 and the silicon substrate 10. For example, the etching process is performed using RIE. As a result, the silicide layer is not formed on the silicon layer 30, and it can definitely be formed between the plug 90 and the silicon substrate 10.

FIG. 2A-FIG. 2I are cross-sectional views showing a method for forming a silicon-on-insulator FET according to a second preferred embodiment of a present invention.

Figure 2A:
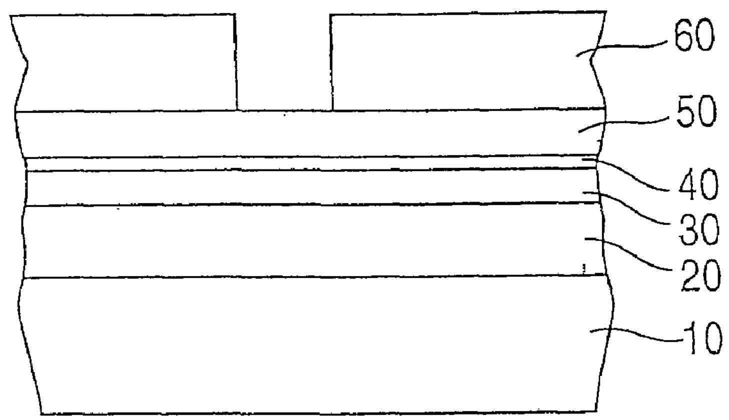
FIG. 2A-FIG. 2I are cross-sectional views showing a method for forming a silicon-on insulator FET according to a second preferred embodiment of a present invention.

As shown in FIG. 2A, a silicon-on-insulator (SOI) structure is provided. Examples of the methods to form the SOI structure are called SIMOX or a bonded wafer. The SOI structure is made up of a silicon substrate 10, an insulating layer 20, and a silicon layer 30. Then, a silicon oxide film 40 and a silicon nitride layer 50 are sequentially formed on the silicon layer 30. Then, a first resist pattern 60 is overlaid the silicon nitride layer 50. The first resist pattern 60 has an opening corresponding to a portion in which is formed a contact hole for substrate-biasing. The first resist pattern 60 has other openings corresponding to each of portions in which is formed isolating portions between active regions (transistor region) in the silicon layer 30 (not shown).

Figure 2B:
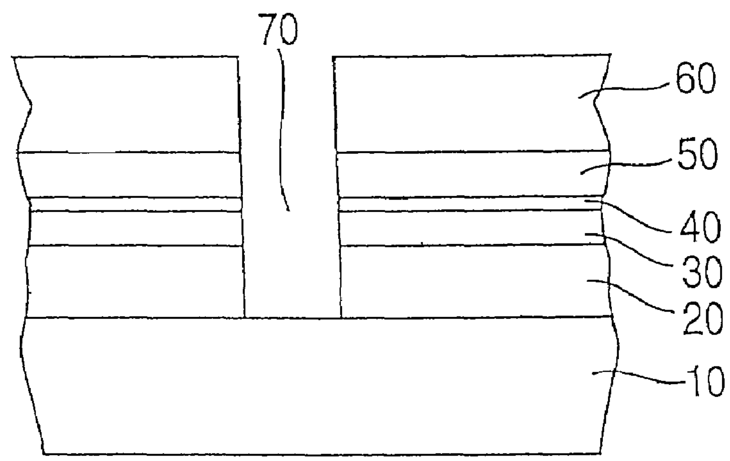

As shown in FIG. 2B, the silicon nitride layer 50, the silicon oxide film 40, the silicon layer 30, and the Insulating layer 20 are etched using the first resist pattern 60 as an etching mask. As a result, a first contact hole 70 for substrate-biasing is formed so as to pass through the silicon nitride layer 50, the silicon oxide film 40, the silicon layer 30 and the insulating layer 20. Then, the first resist pattern 60 is removed.

Figure 2C:
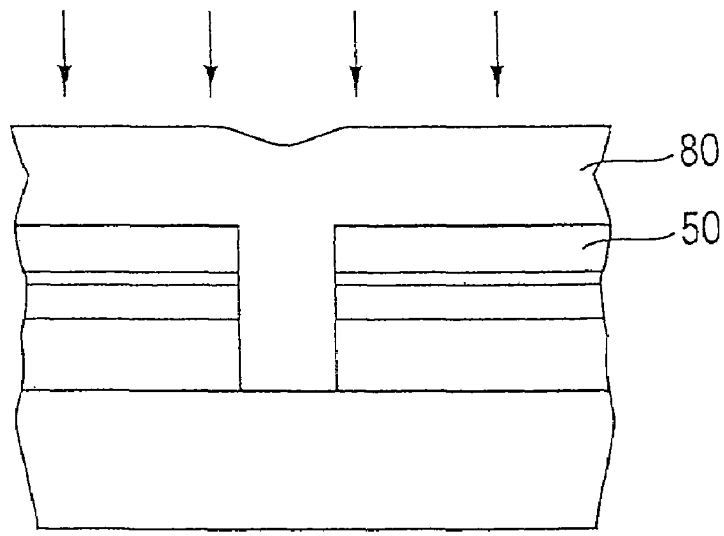

As shown in FIG. 2C, a polycrystalline silicon layer 80 is formed so as to fill the first contact hole 70 and overlie the silicon nitride layer 50. The polycrystalline silicon layer 80 is provided as having a low-resistance contact by implanting ions. The ions are also diffused in a portion of the silicon substrate 10 is for the substrate-biasing by annealing. Therefore, a diffused region in the silicon substrate 10 is formed by processes of the ion-implantation and the annealing, which can decrease the contact resistance for the substrate-biasing.

The diffused region may be formed by implanting ions in the first contact hole 70 and by annealing.

Figure 2D:
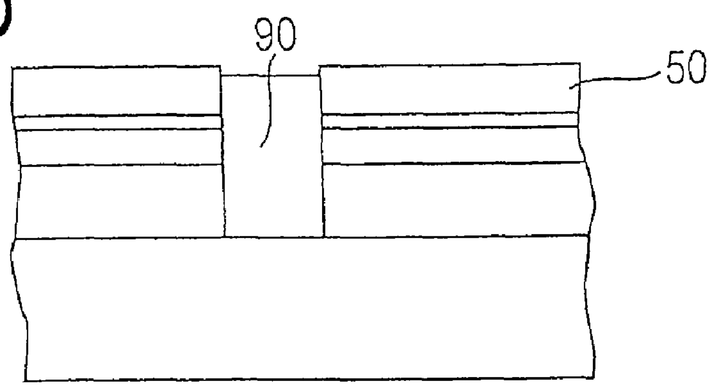

As shown in FIG. 2D, the polycrystalline silicon layer 80 is polished until a surface of the silicon nitride layer 50 is exposed by using CMP. As a result, a first conductive contact layer (plug) 90 of the polycrystalline silicon layer 80 is formed in the first contact hole 70.

Figure 2E:
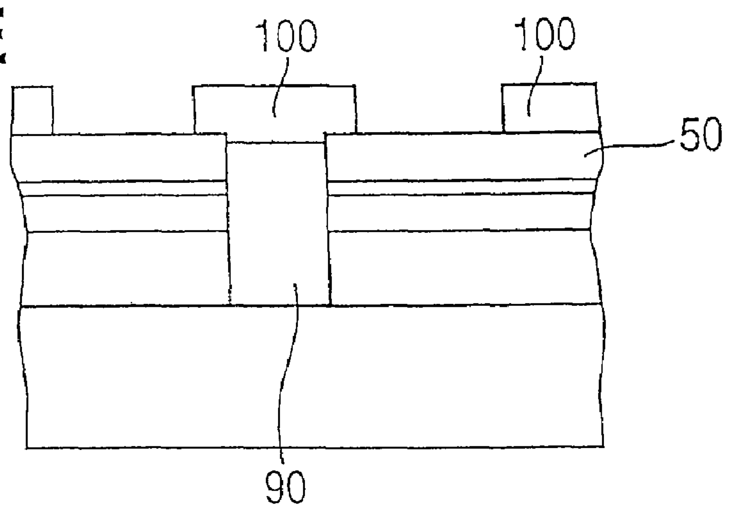

As shown In FIG. 2E, a second resist pattern 100 has an opening so as to expose a top surface of the silicon nitride layer 50 around a top of the plug 90. Here, the second resist pattern 100 is overlaid the top of the plug 90.

Figure 2F:
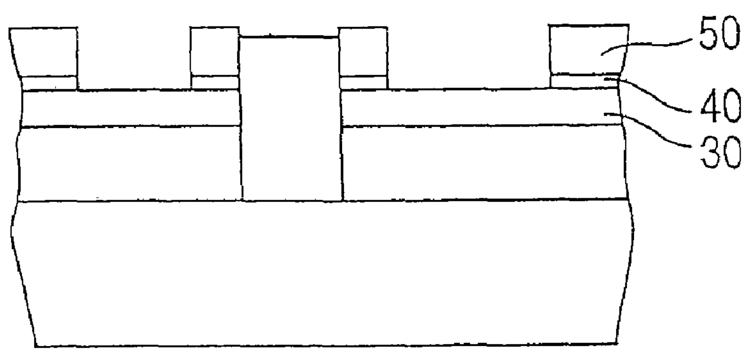

As shown in FIG. 2F, the silicon oxide film 40 and the silicon nitride layer 50 are etched using the second resist pattern 100 as an etching mask. As a result, the silicon layer 30 spaced from the plug 90 is exposed. Then, the second resist pattern 100 is removed.

Figure 2G:
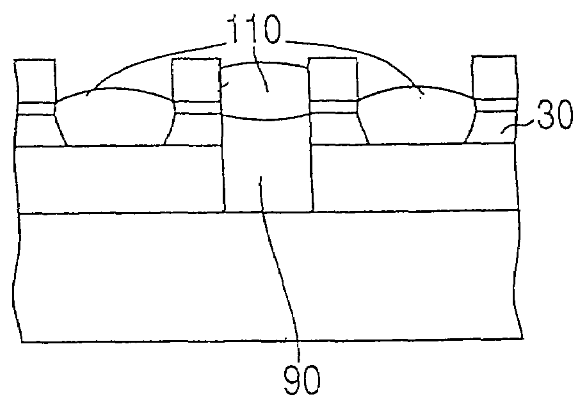

As shown in FIG. 2G, the annealing process is performed. As a result, the tip of the plug 90 and a portion of the silicon layer 30 around the tip of the plug 90 is changed from silicon and polycrystalline silicon to an oxide. Thus, a field oxide film 110 is formed on each portions of the tip of the plug 90 and the portion of the silicon layer 30 around the tip of the plug 90. The field oxide film 110 on the portion of the silicon layer 30 serves as an isolation region in the silicon layer 30. The field oxide film 110 on the portion of the silicon layer 30 defines an active region (transistor region) in the silicon layer 30. The top surface of the field oxide film 110 on the plug 90 can be a low height level because a field oxidation process is performed to the tip of the plug 90. Accordingly, the field oxidation process may improve the planation for interlayer insulating layers.

Figure 2H:
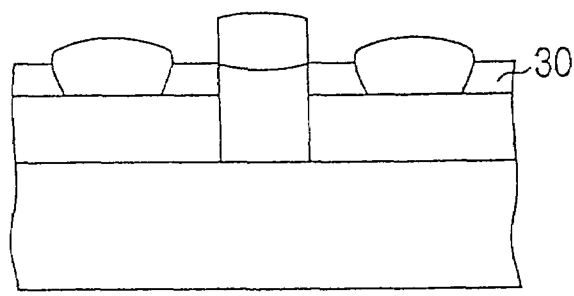

As shown in FIG. 2H, the silicon nitride layer 50 and the silicon oxide film 40 are removed.

Figure 2I:
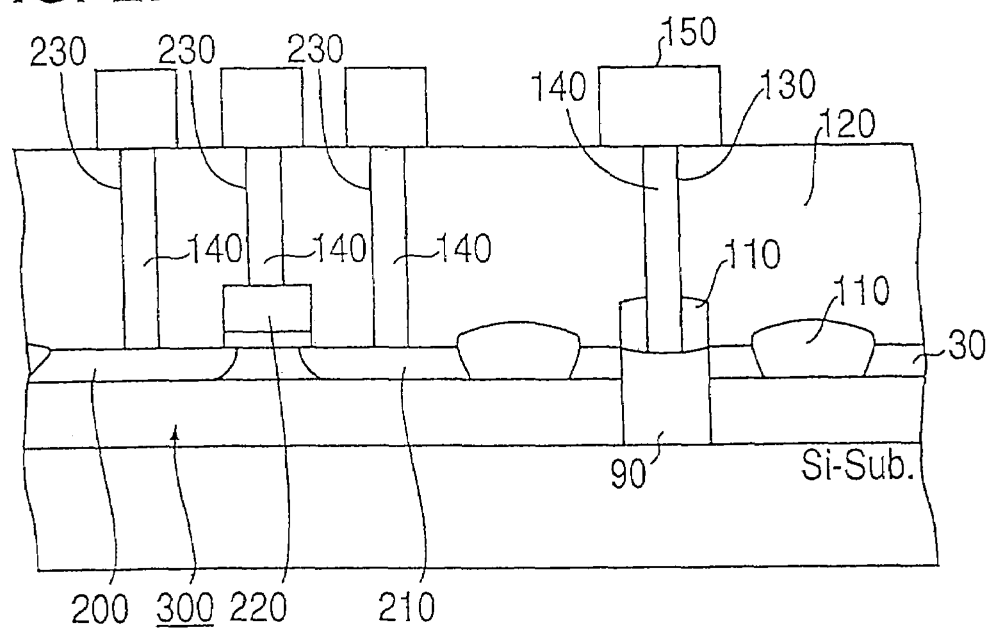

As shown in FIG. 2I, a FET 300 having a source 200, a drain 210, and a gate 220 are formed in the active region of the silicon layer 30. Then, an interlayer insulating layer 120 is overlaid an entire structure including the field oxide film 110 and the silicon layer 30 using CVD process. Here, the interlayer insulating layer 120 is a P-TEOS, a BPSG, or an NSG. Then, a second contact hole 130 is formed so as to pass through the interlayer insulating layer 120 and the field oxide film 110 and to expose a surface of the plug 90. The second contact hole 130 is formed so as to correspond to the first contact hole 70. Third contact holes 230 are formed so as to expose a source 200, a drain 210 and a gate 220 in the silicon layer 30, simultaneously with the second contact hole 130. The simultaneously forming process can be performed because the second and third contact holes 130 and 230 have the substantially same depth. Then, a conductive layer is overlaid the interlayer insulating layer 120 so as to fill the second and third contact holes 130 and 230. Then, the conductive layer is polished until a surface of the interlayer insulating layer 120 is exposed using CMP. As a result, second conductive contact layers 140 are simultaneously formed in the second and third contact holes 130 and 230. Here, the conductive layer is tungsten (W). Then, an interconnection 150 is electrically connected to the respective second conductive contact layers 140.

As mentioned above, in the second preferred embodiment, the substrate-biasing between the SOI transistor and the silicon substrate 10 is performed via the plug 90. As a result, the contact hole for the substrate-biasing does not need to pass through the insulating layer 20, the silicon layer 30,and the interlayer insulating layer 120. Therefore, the interlayer insulating layer 120 can have shallow depth. Accordingly, by the second preferred embodiment the ions can be implanted to the surface of the substrate via the contact hole for substrate-biasing. It can form the contact hole for substrate-biasing without the contact hole for substrate-biasing causing an opening fault. It can be avoided the problem that the FET is electrically connected to the conductive contact layer in the contact hole because the plug is formed so as to be isolated from the active region of the silicon layer.

Further, in the second preferred embodiment, the field oxide film is formed so as to surround the periphery of the plug. As a result, it could be definitely avoided the problem that the conductive contact layer is electrically connected to the transistor region in the silicon layer.

In the second preferred embodiment, a shallow trench isolation layer may be used instead of the field oxide film. The third contact hole may be formed for only the source and the drain, or it may be formed for only one of the source and the drain.

FIG. 3A-FIG. 3I are cross-sectional views showing a method for forming a silicon-on-insulator FET according to a third preferred embodiment of a present invention.

Figure 3A:
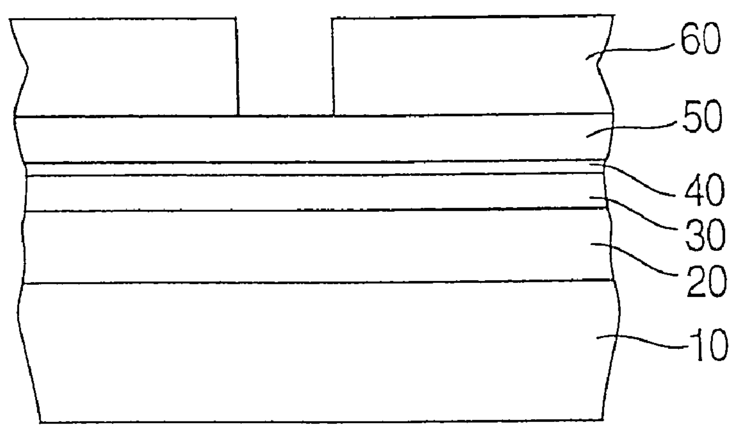
FIG. 3A-FIG. 3I are cross-sectional views showing a method for forming a silicon-on-insulator FET according to a third preferred embodiment of a present invention.

As shown in FIG. 3A, a silicon-on-insulator (SOI) structure is provided. Examples of the methods to form the SOI structure are called SIMOX or a bonded wafer. The SOI structure is made up of a silicon substrate 10, an insulating layer 20, and a silicon layer 30. Then, a silicon oxide film 40 and a silicon nitride layer 50 are sequentially formed on the silicon layer 30. Then, a first resist pattern 60 is overlaid the silicon nitride layer 50. The first resist pattern 60 has an opening corresponding to a portion in which is formed a contact hole for substrate-biasing. The first resist pattern 60 has other openings corresponding to each of portions in which are formed isolating portions between active regions (transistor region) in the silicon layer 30 (not shown).

Figure 3B:
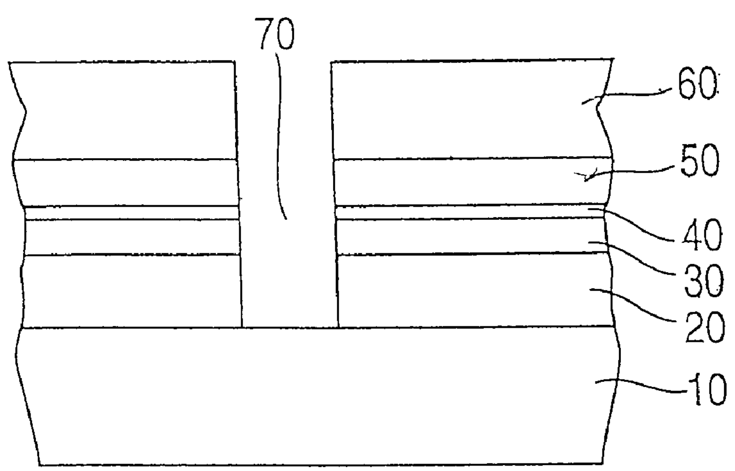

As shown in FIG. 3B, the silicon nitride layer 50, the silicon oxide film 40, the silicon layer 30, and the insulating layer 20 are etched using the first resist pattern 60 as an etching mask. As a result, a first contact hole 70 for substrate-biasing is formed so as to pass through the silicon nitride layer 50, the silicon oxide film 40, the silicon layer 30, and the insulating layer 20. Then, the first resist pattern 60 is removed.

Figure 3C:
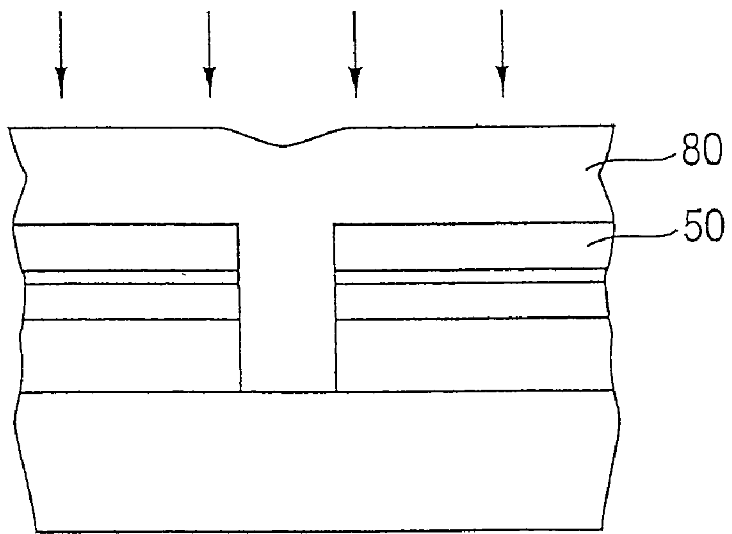

As shown in FIG. 3C, a polycrystalline silicon layer 80 is formed so as to fill the first contact hole 70 and overlie the silicon nitride layer 50. The polycrystalline silicon layer 80 is provided as a low-resistance contact by implanting ions. The ions are also diffused in a portion of the silicon substrate 10 for the substrate-biasing by annealing. Therefore, a diffused region in the silicon substrate 10 is formed by processes of the ion-implantation and the annealing, which can decrease the contact resistance for the substrate-biasing.

The diffused region may be formed by implanting ions in the first contact hole 70 and by annealing.

Figure 3D:
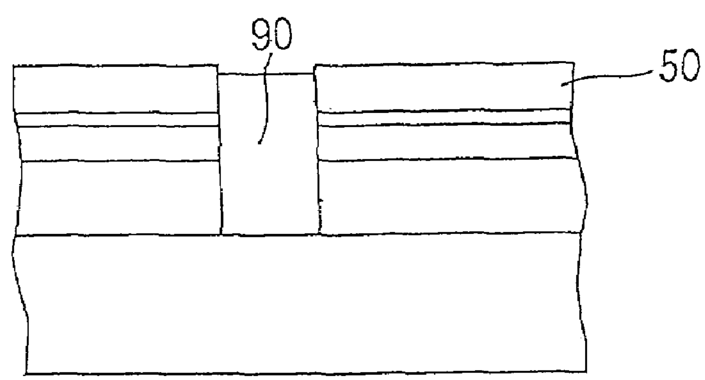

As shown in FIG. 3D, the polycrystalline silicon layer 80 is polished until a surface of the silicon nitride layer 50 is exposed by using CMP. As a result, a first conductive contact layer (plug) 90 of the polycrystalline silicon layer 80 is formed In the first contact hole 70.

Figure 3E:
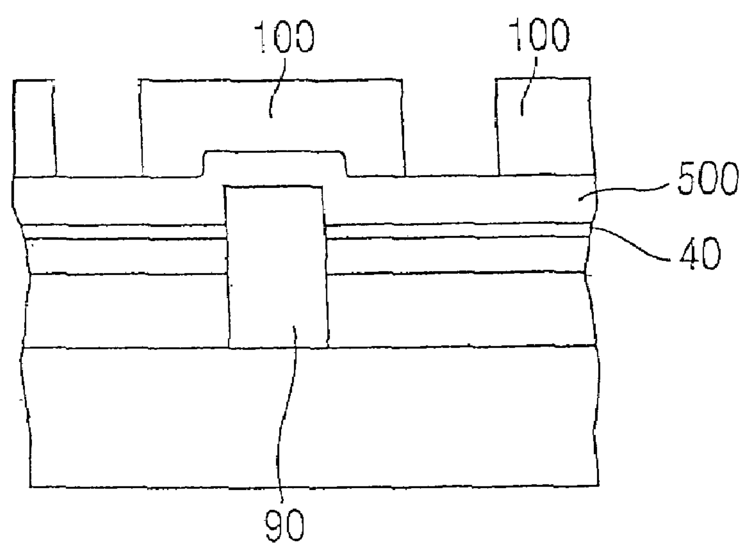

As shown in FIG. 3E, the silicon nitride layer 50 is removed. Then, new silicon nitride layer 500 is formed so as to overlie a top of the plug 90 and the silicon oxide film 40. Then, a second resist pattern 100 has an opening so as to expose a top surface of the silicon nitride layer 50 around an upper portion of the plug 90. Here, the second resist pattern 100 is overlaid the upper portion of the plug 90.

Figure 3F:
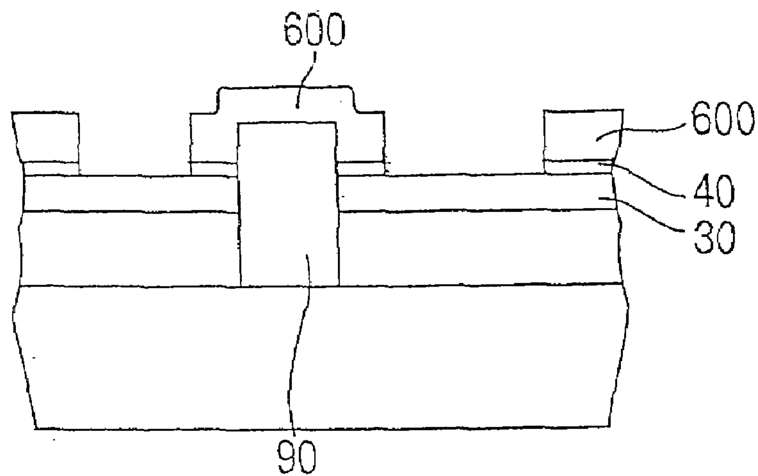

As shown In FIG. 3F, the silicon oxide film 40 and the silicon nitride layer 500 are etched using the second resist pattern 100 as an etching mask. As a result, the silicon layer 30 spaced from the plug 90 is exposed. Then, the second resist pattern 100 is removed. Accordingly, a patterned silicon nitride layer 600 is provided that has an opening so as to expose a top surface of the silicon layer 30 around an upper portion of the plug 90. Here, the patterned silicon nitride layer 600 is overlaid the top of the plug 90.

Figure 3G:
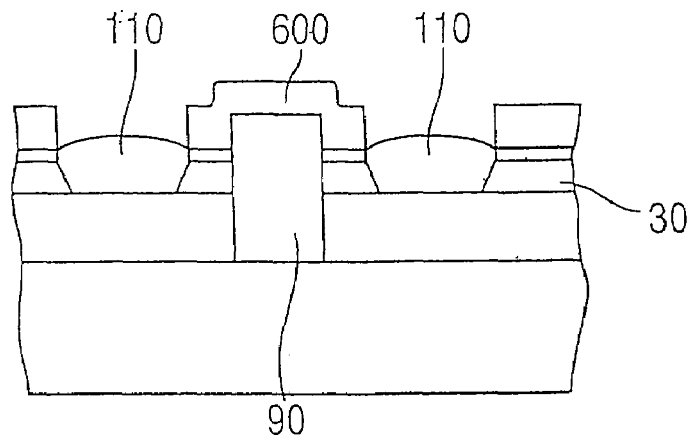

As shown in FIG. 3G, in state of overlying the plug 90 with the patterned silicon nitride layer, the annealing process is performed. As a result, only a portion of the silicon layer 30 around the tip of the plug 90 is changed from silicon and polycrystalline silicon to an oxide. Thus, a field oxide film 110 is formed on the portion of the silicon layer 30 around the tip of the plug 90. The field oxide film 110 on the portion of the silicon layer 30 serves as an isolation region in the silicon layer 30. The field oxide film 110 on the portion of the silicon layer 30 defines an active region (transistor region) in the silicon layer 30.

Figure 3H:
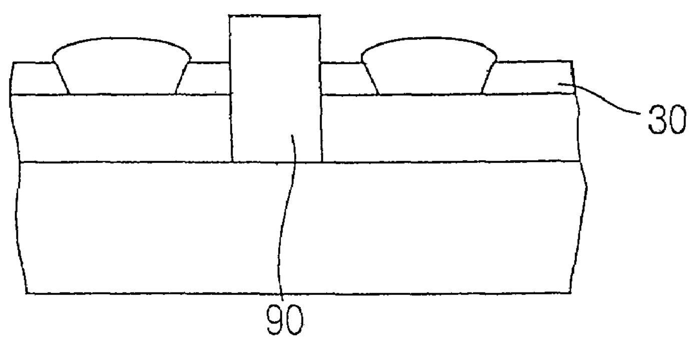

As shown in FIG. 3H, the patterned silicon nitride layer and the silicon oxide film 40 are removed.

Figure 3I:
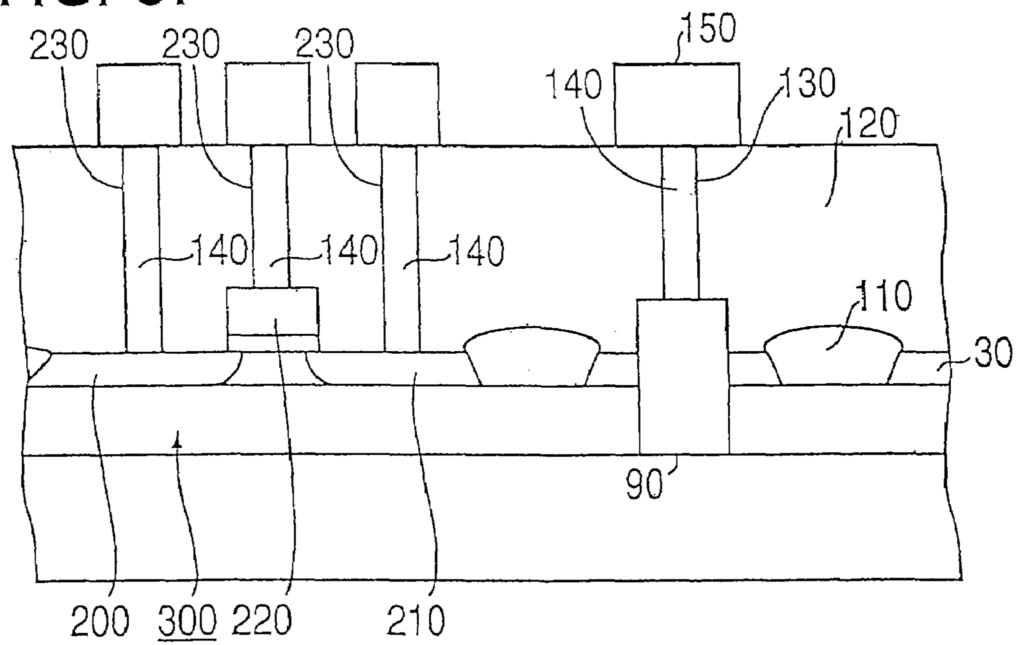

As shown in FIG. 3I, a FET 300 having a source 200, a drain 210, and a gate 220 are formed in the active region of the silicon layer 30. Then, an interlayer insulating layer 120 is overlaid an entire structure including the field oxide film 110 and the silicon layer 30 using CVD process. Here, the interlayer insulating layer 120 is a P-TEOS, a BPSG, or an NSG. Then, a second contact hole 130 is formed so as to pass through the interlayer insulating layer 120 and the field oxide film 110 and to expose a surface of the plug 90. The second contact hole 130 is formed so as to correspond to the first contact hole 70. Third contact holes 230 are formed so as to expose a source 200, a drain 210, and a gate 220 in the silicon layer 30, simultaneously with the second contact hole 130. The simultaneously forming process can be performed because the second and third contact holes 130 and 230 have the substantially same depth. Then, a conductive layer is overlaid the interlayer insulating layer 120 so as to fill the second and third contact holes 130 and 230. Then, the conductive layer is polished until a surface of the interlayer insulating layer 120 is exposed using CMP. As a result, second conductive contact layers 140 are simultaneously formed in the second and third contact holes 130 and 230. Here, the conductive layer is tungsten (W). Then, an interconnection 150 is electrically connected to the respective second conductive contact layers 140.

As mentioned above, in the third preferred embodiment, the substrate-biasing between the SOI transistor and the silicon substrate 10 is performed via the plug 90. As a result, the contact hole for the substrate-biasing does not need to pass through the insulating layer 20, the silicon layer 30, and the interlayer insulating layer 120. Therefore, the interlayer insulating layer 120 can have shallow depth. Accordingly, by the third preferred embodiment the ions can be implanted to the surface of the substrate via the contact hole for substrate-biasing. It can form the contact hole for substrate biasing without the contact hole for substrate-biasing causing an opening fault. It can be avoided the problem that the FET is electrically connected to the conductive contact layer in the contact hole because the plug is formed so as to be isolated from the active region of the silicon layer.

Further, in the third preferred embodiment, the field oxide film is formed so as to surround the periphery of the plug. As a result, it could be definitely avoided the problem that the conductive contact layer is electrically connected to the transistor region in the silicon layer.

Further, the third preferred embodiment could be formed so as to protrude a tip of the plug 90. Therefore, a thickness of the plug is thicker than the first and second preferred embodiments. Accordingly, since the contact hole could be shallower than the first and second preferred embodiments, it can form the contact hole for substrate-biasing without the contact hole causing an opening fault.

In the third preferred embodiment, a shallow trench isolation layer may be used instead of the field oxide film. The third contact hole may be formed for only the source and the drain, or it may be formed for only one of the source and the drain.

FIG. 4A-FIG. 4G are cross-sectional views showing a method for forming a silicon-on insulator FET according to a fourth preferred embodiment of a present invention.

Figure 4A:
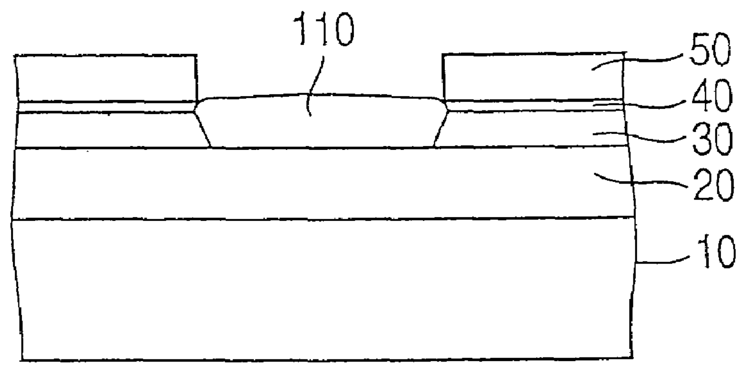
FIG. 4A-FIG. 4G are cross-sectional views showing a method for forming a silicon-on-insulator FET according to a fourth preferred embodiment of a present invention.

As shown in FIG. 4A, a silicon-on-insulator (SOI) structure is provided. Examples of the methods to form the SOI structure are called SIMOX or a bonded wafer. The SOI structure is made up of a silicon substrate 10, an insulating layer 20, and a silicon layer 30. Then, a silicon oxide film 40 and a silicon nitride layer 50 are sequentially formed on the silicon layer 30. Then, a first resist pattern (not shown) is overlaid the silicon nitride layer 50. The first resist pattern has an opening corresponding to an isolation region in the silicon layer 30. Then, the annealing process is performed. As a result, a portion of the silicon layer 30 of the isolation region is changed from silicon and polycrystalline silicon to an oxide. Thus, a field oxide film 110 is formed in the isolation region in the silicon layer 30. The field oxide film 110 defines a transistor region in the silicon layer 30.

Figure 4B:
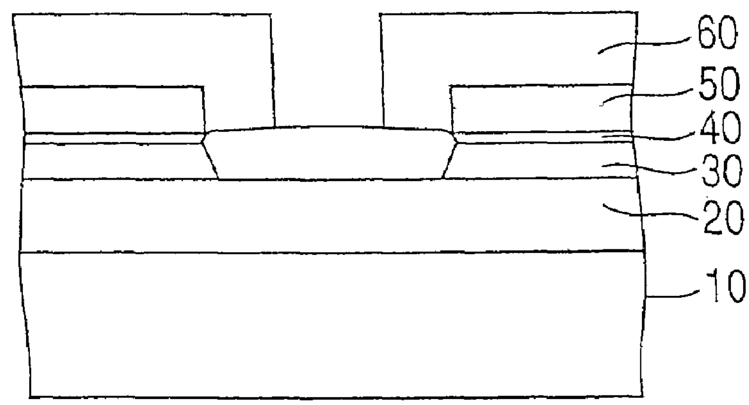

As shown in FIG. 4B, a second resist pattern 60 is overlaid the silicon nitride layer 50. The second resist pattern 60 has an opening so as to expose an upper portion of the field oxide film 110 in a region in which is formed a contact hole for substrate-biasing.

Figure 4C:
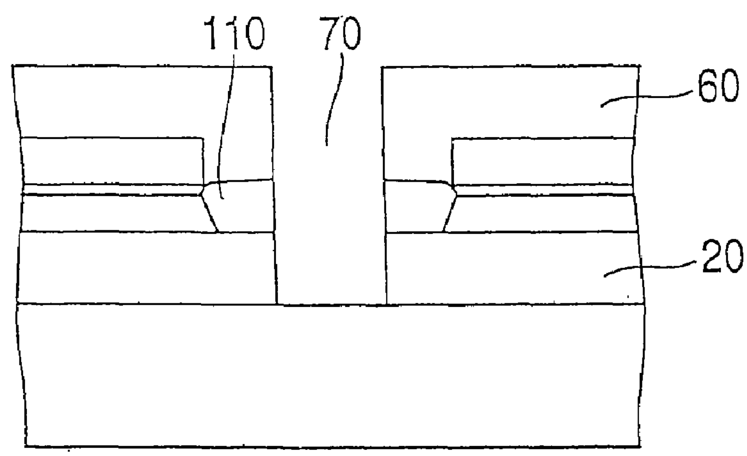

As shown in FIG. 4C, the field oxide film 110 and the silicon layer 30 are etched using the second resist pattern 60 as an etching mask. As a result, a first contact hole 70 is formed so as to pass through the field oxide film 110 and the silicon layer 30.

Figure 4D:
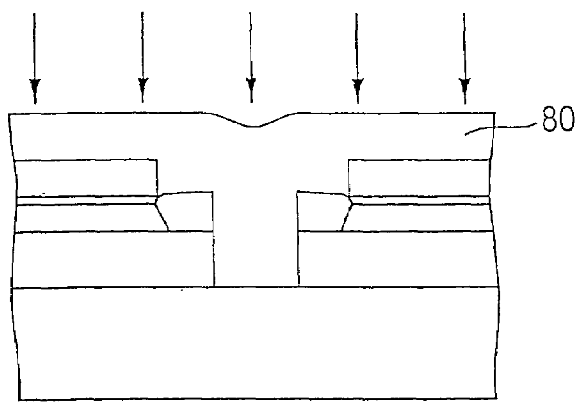

As shown in FIG. 4D, a polycrystalline silicon layer 80 is formed so as to fill the first contact hole 70 and overlie the silicon nitride layer 50. The polycrystalline silicon layer 80 is provided as a low-resistance contact by implanting ions. The ions are also diffused in a portion of the silicon substrate 10 for the substrate-biasing by annealing. Therefore, a diffused region in the silicon substrate 10 is formed by processes of the ion-implantation and the annealing, which can decrease the contact resistance for the substrate-biasing.

The diffused region may be formed by implanting ions in the first contact hole 70 and by annealing.

Figure 4E:
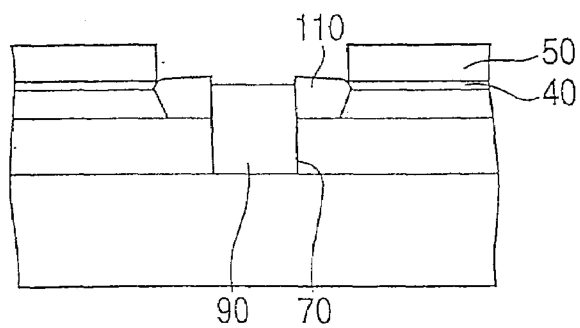

As shown in FIG. 4E, the polycrystalline silicon layer 80 is polished until a surface of the silicon nitride layer 50 and the field oxide film 110 is exposed by using CMP. As a result, a first conductive contact layer (plug) 90 of the polycrystalllne silicon layer 80 is formed in the first contact hole 70.

Figure 4F:
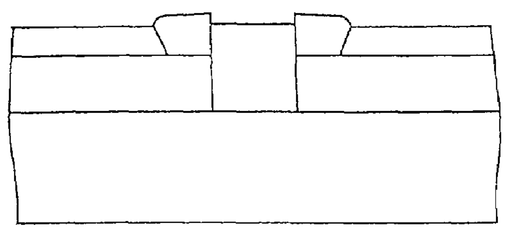

As shown in FIG. 4F, the silicon nitride layer 50 and the silicon oxide film 40 are removed.

Figure 4G:
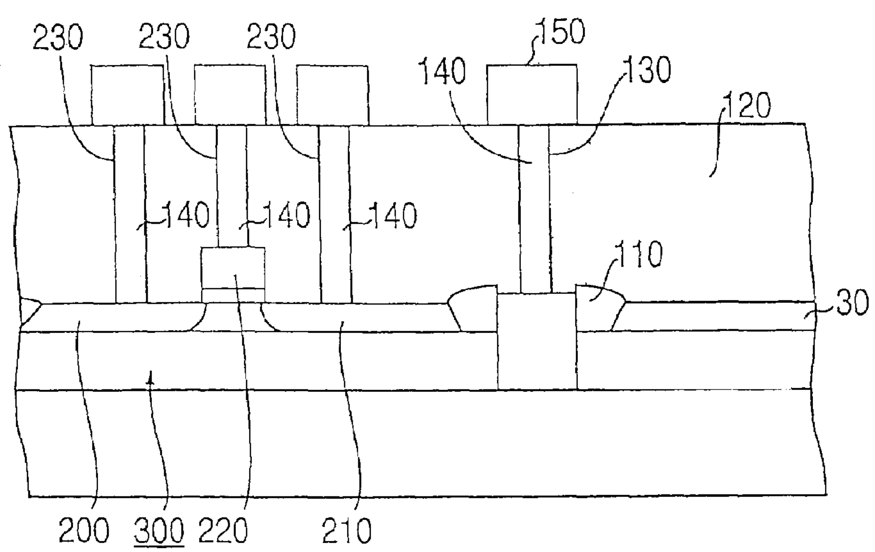

As shown in FIG. 4G, a FET 300 having a source 200, a drain 210, and a gate 220 are formed in the active region of the silicon layer 30. Then, an interlayer insulating layer 120 is overlaid an entire structure including the field oxide film 110 and the silicon layer 30 using CVD process. Here, the interlayer insulating layer 120 is a P-TEOS, a BPSG, or an NSG. Then, a second contact hole 130 is formed so as to pass through the interlayer insulating layer 120 and the field oxide film 110 and to expose a surface of the plug 90. The second contact hole 130 is formed so as to correspond to the first contact hole 70. Third contact holes 230 are formed so as to expose a source 200, a drain 210, and a gate 220 in the silicon layer 30, simultaneously with the second contact hole 130. The simultaneously forming process can be performed because the second and third contact holes 130 and 230 have the substantially same depth. Then, a conductive layer is overlaid the interlayer insulating layer 120 so as to fill the second and third contact holes 130 and 230. Then, the conductive layer is polished until a surface of the interlayer insulating layer 120 is exposed using CMP. As a result, second conductive contact layers 140 are simultaneously formed in the second and third contact holes 130 and 230. Here, the conductive layer is tungsten (W). Then, an interconnection 150 is electrically connected to the respective second conductive contact layers 140.

As mentioned above, in the fourth preferred embodiment, the substrate-biasing between the SOI transistor and the silicon substrate 10 is performed via the plug 90. As a result, the contact hole for the substrate-biasing does not need to pass through the insulating layer 20, the silicon layer 30, and the interlayer insulating layer 120. Therefore, the interlayer insulating layer 120 can have shallow depth. Accordingly, by the fourth preferred embodiment the ions can be implanted to the surface of the substrate via the contact hole for substrate-biasing. It can form the contact hole for substrate-biasing without the contact hole for substrate biasing causing an opening fault. It can be avoided the problem that the FET is electrically connected to the conductive contact layer in the contact hole because the plug is formed so as to be isolated from the active region of the silicon layer.

Further, in the fourth preferred embodiment, first of all, field oxide films as defining the transistor region are formed in the silicon layer of the SOI structure. Then, the plug for the substrate-biasing is formed. Therefore, the fourth preferred embodiment does not need the field oxide film for the substrate-biasing. Accordingly, it could be avoided the problem of increasing the chip size.

Further, in the fourth preferred embodiment, the field oxide film is formed so as to surround the periphery of the plug. As a result, it could be definitely avoided the problem that the conductive contact layer is electrically connected to the transistor region in the silicon layer.

In the fourth preferred embodiment, a shallow trench isolation layer may be used instead of the field oxide film. The third contact hole may be formed for only the source and the drain, or it may be formed for only one of the source and the drain.

FIG. 5A-FIG. 5G are cross-sectional views showing a method for forming a silicon-on-insulator FET according to a fifth preferred embodiment of a present invention.

Figure 5A:
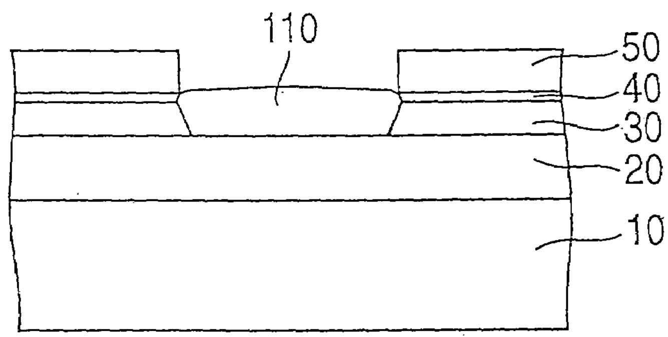
FIG. 5A-FIG. 5G are cross-sectional views showing a method for forming a silicon-on-insulator FET according to a fifth preferred embodiment of a present invention.

As shown In FIG. 5A, a silicon-on-insulator (SOI) structure is provided. Examples of the methods to form the SOI structure are called SIMOX or a bonded wafer. The SOI structure is made up of a silicon substrate 10, an insulating layer 20, and a silicon layer 30. Then, a silicon oxide film 40 and a silicon nitride layer 50 are sequentially formed on the silicon layer 30. Then, a first resist pattern (not shown) is overlaid the silicon nitride layer 50. The first resist pattern has an opening corresponding to an isolation region in the silicon layer 30. Then, the annealing process is performed. As a result, a portion of the silicon layer 30 of the isolation region is changed from silicon and polycrystalline silicon to an oxide. Thus, a field oxide film 110 is formed in the isolation region in the silicon layer 30. The field oxide film 110 defines a transistor region in the silicon layer 30.

Figure 5B:
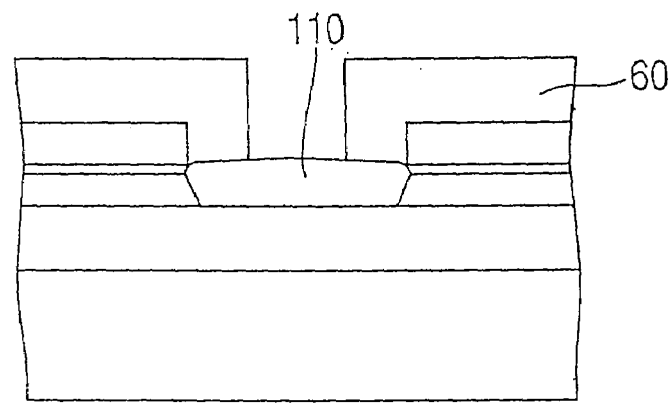

As shown in FIG. 5B, a second resist pattern 60 is overlaid the silicon nitride layer 50. The second resist pattern 60 has an opening so as to expose an upper portion of the field oxide film 110 in a region in which is formed a contact hole for a substrate-biasing.

Figure 5C:
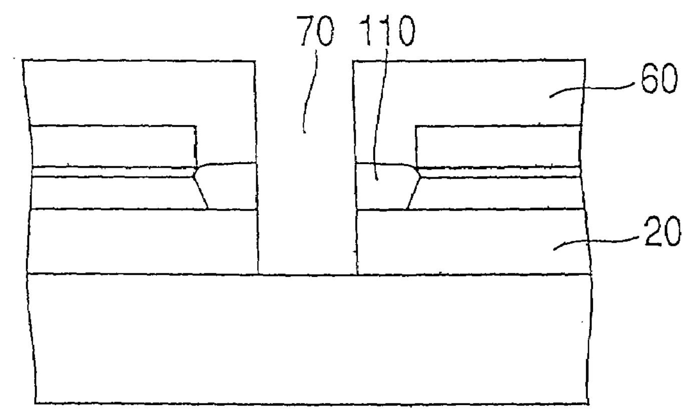

As shown in FIG. 5C, the field oxide film 110 and the silicon layer 30 are etched using the second resist pattern 60 as an etching mask. As a result, a first contact hole 70 is formed so as to pass through the field oxide film 110 and the silicon layer 30.

Figure 5D:
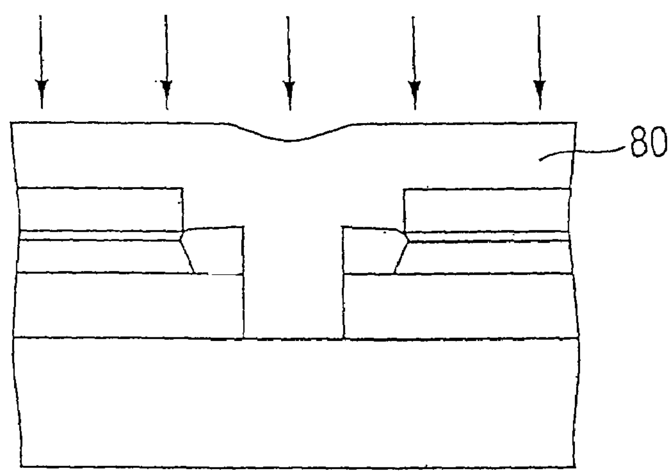

As shown in FIG. 5D, a polycrystalline silicon layer 80 is formed so as to fill the first contact hole 70 and overlie the silicon nitride layer 50. The polycrystalline silicon layer 80 is provided as a low-resistance contact by implanting ions. The ions are also diffused in a portion of the silicon substrate 10 for the substrate-biasing by annealing. Therefore, a diffused region in the silicon substrate 10 is formed by processes of the ion-implantation and the annealing, which can decrease the contact resistance for the substrate-biasing.

The diffused region may be formed by implanting ions in the first contact hole 70 and by annealing.

Figure 5E:
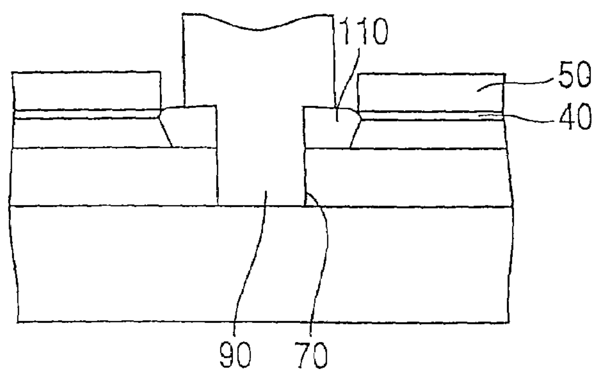

As shown in FIG. 5E, a third resist pattern (not shown) is formed on the polycrystailine silicon layer 80. The third resist pattern has an opening so as to expose a periphery region of the field oxide film 110. The third resist pattern is overlaid a plug forming portion. Then, the polycrystalline silicon layer 80 is etched using the third resist pattern as an etching mask. As a result, a plug 90 is formed in the first contact hole 70.

Figure 5F:
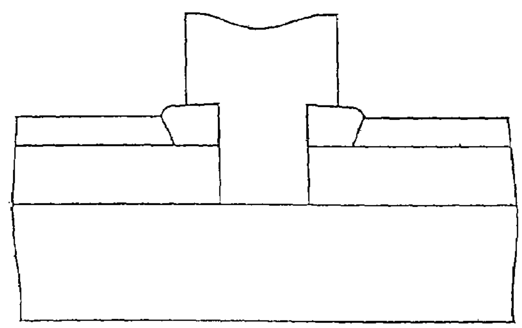

As shown in FIG. 5F, the third resist pattern, the silicon nitride layer 50 and the silicon oxide film 40 are removed.

Figure 5G:
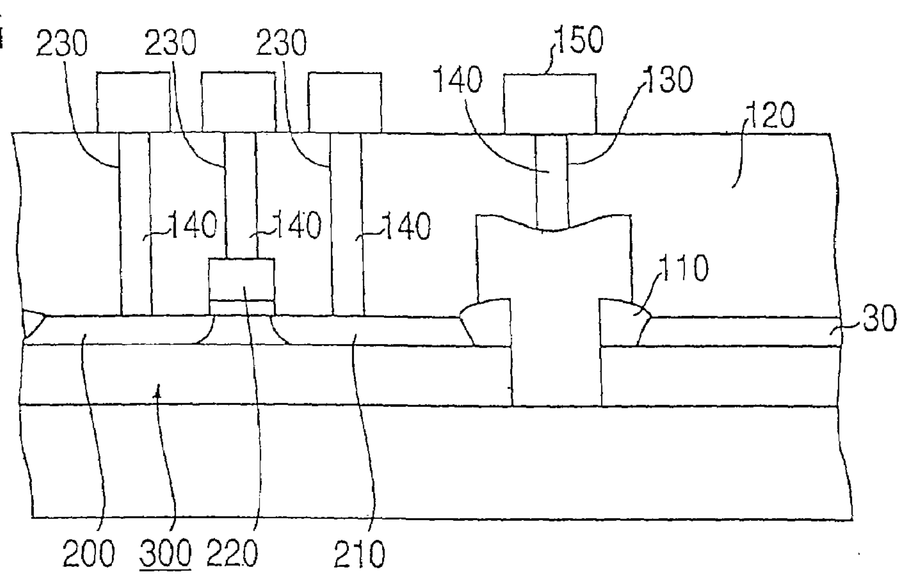

As shown in FIG. 5G, a FET 300 having a source 200, a drain 210, and a gate 220 are formed in the active region of the silicon layer 30. Then, an interlayer insulating layer 120 is overlaid an entire structure including the field oxide film 110 and the silicon layer 30 using CVD process. Here, the interlayer insulating layer 120 is a P-TEOS, a BPSG, or an NSG. Then, a second contact hole 130 is formed so as to pass through the interlayer insulating layer 120 and the field oxide film 110 and to expose a surface of the plug 90. The second contact hole 130 is formed so as to correspond to the first contact hole 70. Third contact holes 230 are formed so as to expose a source 200, a drain 210, and a gate 220 in the silicon layer 30, simultaneously with the second contact hole 130. The simultaneously forming process can be performed because the second and third contact holes 130 and 230 have the substantially same depth. Then, a conductive layer is overlaid the interlayer insulating layer 120 so as to fill the second and third contact holes 130 and 230. Then, the conductive layer is polished until a surface of the interlayer insulating layer 120 is exposed by using CMP. As a result, second conductive contact layers 140 are simultaneously formed in the second and third contact holes 130 and 230. Here, the conductive layer is tungsten (W). Then, an interconnection 150 is electrically connected to the respective second conductive contact layers 140.

As mentioned above, in the fifth preferred embodiment, the substrate-biasing between the SOI transistor and the silicon substrate 10 is performed via the plug 90. As a result, the contact hole for the substrate-biasing does not need to pass through the insulating layer 20, the silicon layer 30, and the interlayer Insulating layer 120. Therefore, the interlayer insulating layer 120 can have shallow depth. Accordingly, by the fifth preferred embodiment the ions can be implanted to the surface of the substrate via the contact hole for substrate-biasing. It can form the contact hole for substrate biasing without the contact hole for substrate-biasing causing an opening fault. It can be avoided the problem that the FET is electrically connected to the conductive contact layer in the contact hole because the plug is formed so as to be isolated from the active region of the silicon layer.

Further, in the fifth preferred embodiment, first of all, field oxide films as defining the transistor region are formed in the silicon layer of the SOI structure. Then, the plug for the substrate-biasing is formed. Therefore, the fourth preferred embodiment does not need the field oxide film for the substrate-biasing. Accordingly, it could be avoided the problem of increasing the chip size.

Further, in the fifth preferred embodiment, the field oxide film is formed so as to surround the periphery of the plug. As a result, it could be definitely avoided the problem that the conductive contact layer is electrically connected to the transistor region in the silicon layer.

In the fifth preferred embodiment, a shallow trench isolation layer may be used instead of the field oxide film. The third contact hole may be formed for only the source and the drain, or it may be formed for only one of the source and the drain.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed as:

1. A method for forming a silicon-on-insulator FET providing a contact to be given a fixed potential to a substrate, the method comprising:

providing a substrate having a semiconductor substrate, an insulating layer located on the semiconductor substrate and a silicon layer located on the insulating layer;

forming a mask layer over the silicon layer, the mask layer having an opening that exposes the silicon layer;

forming an isolating layer in a part of the silicon layer exposed by the opening;

forming a conductive layer extending through the isolating layer and the insulating layer, and on an upper surface of the mask layer, the conductive layer electrically connected to the semiconductor substrate;

removing the conductive layer from the upper surface of the mask layer, the conductive layer that remains being a first conductive contact layer;

removing the mask layer;

forming an interlayer-insulating layer overlying the silicon layer and the first conductive contact layer;

forming a through-hole in the interlayer-insulating layer, the through-hole formed so as to correspond to the first conductive contact layer; and filling a second conductive contact layer in the through-hole.

2. The method for forming a silicon-on-insulator FET as claimed in claim 1, wherein the silicon layer includes a source, a drain, and a gate.

3. The method for forming a silicon-on-insulator FET as claimed in claim 2, wherein all of the source, the drain, and the gate are formed after forming the isolating layer.

4. The method for forming a silicon-on-insulator FET as claimed in claim 1, wherein the isolating layer comprises a field oxide film or a shallow trench isolating layer.

5. The method for forming a silicon-on-insulator FET as claimed in claim 1, further comprising implanting ions to the semiconductor substrate during said forming a conductive layer.

6. The method for forming a silicon-on-insulator FET as claimed in claim 1, wherein the conductive layer is removed so that the first conductive contact layer extends on an upper surface of the isolating layer.

7. The method for forming a silicon-on-insulator FET as claimed in claim 1, wherein a width of the first conductive contact layer is greater than a width of the second conductive contact layer.

8. A method for forming a silicon-on-insulator FET providing a contact to be given a fixed potential to a substrate, the method comprising:

providing a substrate having a semiconductor substrate, an insulating layer located on the semiconductor substrate and a silicon layer located on the insulating layer;

forming a mask layer over the silicon layer, the mask layer having an opening that exposes the silicon layer;

forming an isolating layer in a part of the silicon layer exposed by the opening;

forming a first through-hole passing through the isolating layer and the insulating layer;

filling a conductive layer in the first through-hole and on an upper surface of the mask layer, the conductive layer electrically connected to the semiconductor substrate;

removing the conductive layer from the upper surface of the mask layer, the conductive layer that remains being a first conductive contact layer;

removing the mask layer;

forming an interlayer-insulating layer overlying the silicon layer and the first conductive contact layer;

forming a second through-hole in the interlayer-insulating layer, the second through-hole formed so as to correspond to the first conductive contact layer; and filling a second conductive contact layer in the second through-hole.

9. The method for forming a silicon-on-insulator FET as claimed in claim 8, further comprising:

providing a source, a drain, and a gate in the silicon layer;

simultaneously forming at least one third through-hole with the second through-hole in the interlayer-insulating layer, the at least one third through-hole formed so as to respectively correspond to at least one of the source, the drain, and the gate; and filling a third conductive contact layer in the at least one third through-hole simultaneously with said filling a second conductive contact layer.

10. The method for forming a silicon-on-insulator FET as claimed in claim 9, wherein all of the source, the drain, and the gate are formed after forming the isolating layer.

11. The method for forming a silicon-on-insulator FET as claimed in claim 8, wherein the isolating layer comprises a field oxide film or a shallow trench isolating layer.

12. The method for forming a silicon-on-insulator FET as claimed in claim 8, further comprising implanting ions to the semiconductor substrate via the first through-hole.

13. The method for forming a silicon-on-insulator FET as claimed in claim 8, wherein the conductive layer is removed so that the first conductive contact layer extends on an upper surface of the isolating layer.

14. The method for forming a silicon-on-insulator FET as claimed in claim 8, wherein a width of the first conductive contact layer is greater than a width of the second conductive contact layer.

15. A method of forming a silicon-on-insulator FET comprising:

providing a substrate having a semiconductor substrate, an insulating layer on the semiconductor substrate, and a silicon layer on the insulating layer;

forming a mask layer on the silicon layer, the mask layer having an opening that exposes the silicon layer;

forming an isolating layer in a part of the silicon layer exposed by the opening;

forming a first through hole extending through the isolating layer and the insulating layer to expose the semiconductor substrate;

filling a conductive layer in the first through hole and on an upper surface of the mask layer, the conductive layer electrically connected to the semiconductor substrate;

removing the conductive layer from the upper surface of the mask layer, the conductive layer that remains being a first conductive contact layer;

removing the mask layer;

forming an interlayer insulating layer on the silicon layer, the isolating layer and the first conductive contact layer;

forming a second through hole extending through the interlayer insulating layer to expose the first conductive contact layer; and filling a second conductive contact layer in the second through hole, the second conductive contact layer electrically connected to the first conductive contact layer.

16. The method of forming a silicon-on-insulator FET of claim 15, wherein a diameter of the first through hole is greater than a diameter of the second through hole.

17. The method of forming a silicon-on-insulator FET of claim 15, wherein the conductive layer is removed so that the first conductive contact layer extends on a top surface of the isolating layer.

18. The method of forming a silicon-on-insulator FET of claim 15, further comprising implanting ions into the semiconductor substrate through the first through hole prior to said filling a conductive layer.

19. The method of forming a silicon-on-insulator FET of claim 15, further comprising forming a source, a drain and a gate in the silicon layer after said forming an isolating layer.

20. The method of forming a silicon-on-insulator FET of claim 15, wherein the isolating layer is formed as a field oxide film or a shallow trench isolating layer.

* * * * *